(12) United States Patent
Urakawa et al.

(10) Patent No.: US 10,184,992 B2
(45) Date of Patent: Jan. 22, 2019

(54) ROTATION SPEED MEASURING SYSTEM

(71) Applicant: AICHI STEEL CORPORATION, Tokai-shi (JP)

(72) Inventors: Kazuo Urakawa, Aichi (JP); Michiharu Yamamoto, Aichi (JP)

(73) Assignee: AICHI STEEL CORPORATION, Tokai-shi (JP)

(*) Notice: Subject to any disclaimer, the term of this patent is extended or adjusted under 35 U.S.C. 154(b) by 157 days.

(21) Appl. No.: 15/209,883

(22) Filed: Jul. 14, 2016

(65) Prior Publication Data

US 2017/0023602 A1    Jan. 26, 2017

(30) Foreign Application Priority Data

Jul. 21, 2015 (JP) .................. 2015-144295

(51) Int. Cl.
| | | |
|---|---|---|
| *G01P 3/48* | (2006.01) | |
| *G01R 33/06* | (2006.01) | |
| *G01P 3/487* | (2006.01) | |
| *G01P 15/18* | (2013.01) | |

(52) U.S. Cl.
CPC ............ *G01R 33/063* (2013.01); *G01P 3/487* (2013.01); *G01P 15/18* (2013.01)

(58) Field of Classification Search
USPC ..................................... 73/514.39
See application file for complete search history.

(56) References Cited

U.S. PATENT DOCUMENTS

| | | | | |
|---|---|---|---|---|
| 6,151,563 A | * | 11/2000 | Marinelli ............... | A63B 43/00 473/569 |
| 2013/0274040 A1 | * | 10/2013 | Coza ................. | G09B 19/0038 473/570 |
| 2013/0342197 A1 | | 12/2013 | Uchiyama et al. ......... | 324/258 |
| 2016/0121164 A1 | * | 5/2016 | Coza ................. | G09B 19/0038 473/570 |

FOREIGN PATENT DOCUMENTS

| | | |
|---|---|---|
| JP | 2012-185103 | 9/2012 |
| JP | 2013-221942 | 10/2013 |
| JP | 2014-160025 | 9/2014 |

* cited by examiner

*Primary Examiner* — Clayton E Laballe
*Assistant Examiner* — Warren K Fenwick
(74) *Attorney, Agent, or Firm* — Oblon, McClelland, Maier & Neustadt, L.L.P.

(57) ABSTRACT

A rotation speed measuring system includes a magnetic sensor, an acceleration sensor, an end detecting unit, and a calculating unit. The magnetic sensor measures earth magnetism in at least one axis direction. The acceleration sensor measures acceleration in at least one axis direction. The end detecting unit detects a time point of a switch at which an acceleration variation is switched to a large-variation state after a small-variation state, wherein the small-variation state corresponds to a state in which the acceleration variation is equal to or below a predetermined first threshold value and the large-variation state corresponds to a state in which the acceleration variation is equal to or above a predetermined second threshold value. The calculating unit calculates the rotation speed of the ball moving in midair by analyzing a frequency of measurement data on the earth magnetism acquired by the magnetic sensor until the end time point.

16 Claims, 10 Drawing Sheets

3, 4, 5, 6,
111, 112, 12, 13

ROTATION SPEED MEASURING SYSTEM

CROSS-REFERENCE TO RELATED APPLICATION

The present application claims priority under 35 U.S.C. § 119 to Japanese Application No. 2015-144295, filed on Jul. 21, 2015, entitled "ROTATION SPEED MEASURING SYSTEM". The contents of this application are incorporated herein by reference in their entirety.

BACKGROUND OF THE INVENTION

Field of the Invention

The present invention relates to a rotation speed measuring system for measuring the rotation speed of a ball moving in midair.

Description of the Related Art

As a rotation speed measuring system for measuring the rotation speed of a ball moving in midair, a rotation speed measuring system is known that includes a magnetic sensor that measures earth magnetism (see Patent Literature 1 described below). In the rotation speed measuring system, the magnetic sensor is provided in a ball, and temporal changes in output of the magnetic sensor are used to calculate the rotation speed of the ball moving in midair.

When a ball is thrown or kicked, the ball moves in midair while rotating. Rotation of the ball moving in midair causes a cyclic change in direction of the magnetic sensor provided in the ball with respect to earth magnetism. Thus, measurement data on the earth magnetism acquired by the magnetic sensor shows a cyclic change. The above rotation speed measuring system is configured to analyze the frequency of the cyclic change, so as to calculate the rotation speed of the ball moving in midair.

PATENT LITERATURE

[Patent Literature 1] JP-A-2014-160025

SUMMARY OF THE INVENTION

However, the rotation speed measuring system in some cases cannot automatically detect a time point at which midair movement of the ball ends. That is, for example, in the case of catching, with a mitt or the like, a ball moving in midair while rotating at high speed, the catch makes the rotation speed of the ball decrease rapidly. Thus, the frequency of measurement data on earth magnetism rapidly decreases. Therefore, detecting the changes in frequency enables automatic detection of the time point at which the midair movement of the ball ends. In contrast, in the case where a rapid change in rotation speed hardly occurs when the midair movement ends, such as a case of throwing a ball to a net, and a case of throwing a ball with a type of pitch that gives a small rotation speed to the ball, frequency of the measurement data on earth magnetism does not rapidly change. Therefore, it is difficult to detect the time point at which the midair movement of the ball ends.

The present invention has been made in such circumstances, providing a rotation speed measuring system that enables automatic detection of a time point at which the midair movement of a ball ends.

One aspect of the present invention is a rotation speed measuring system that measures a rotation speed of a ball moving in midair, the rotation speed measuring system including:

a magnetic sensor that is provided in the ball and measures earth magnetism at least in one axis direction;

an acceleration sensor that is provided in the ball and measures acceleration at least in one axis direction;

an end detecting unit that detects, as an end time point at which midair movement of the ball is considered to end, a time point of a switch at which an acceleration variation obtained as an absolute value of an variation in the acceleration measured by the acceleration sensor in a predetermined small time unit is switched to a large-variation state after a small-variation state, wherein the small-variation state corresponds to a state in which the acceleration variation is equal to or below a predetermined first threshold value and the large-variation state corresponds to a state in which the acceleration variation is equal to or above a predetermined second threshold value; and a calculating unit that calculates the rotation speed of the ball moving in midair by analyzing a frequency of measurement data on the earth magnetism acquired by the magnetic sensor until the end time point.

In the rotation speed measuring system, the acceleration sensor is provided in a ball. In addition, the rotation speed measuring system is provided with the end detecting unit.

Thus, the end detecting unit enables the detection of the end time point at which the midair movement of the ball can be considered to end. That is, while moving in midair, the ball receives substantially no large external forces except little air resistance. Thus, during the midair movement of the ball, the acceleration sensor hardly detects accelerations caused by external forces, but mainly detects an acceleration caused by a centrifugal force generated by the rotation of the ball. The detected acceleration is substantially constant. Therefore, during this state, the output of the acceleration sensor is substantially constant. At the moment when the ball hits an external object such as a mitt to end the midair movement, the ball receives a great force, and the acceleration of the ball changes greatly in a short time. Thus, making use of changes in acceleration detectable with the acceleration sensor enables to detect the end time point. That is, it is possible to detect, as the end time point, a time point of a switch from a state in which the acceleration does not change greatly for a certain amount of time (the small-variation state) during the time when the ball moves in midair, to a state in which the acceleration changes greatly in a short time (the large-variation state).

It is noted that an acceleration sensor without offset correction does not output zero when an actual acceleration is zero. In addition, if an acceleration sensor cannot be fixed in the center of a ball, the acceleration sensor will receive an acceleration caused by a centrifugal force at high rotation speeds of the ball. Therefore, when detected values from the acceleration sensor, as such, is used to determine the time point of a switch from the small-variation state to the large-variation state, it is difficult to set a threshold value, which may hinder accurate determination. Thus, the present embodiment is configured to determine the time point of the switch from the small-variation state to the large-variation state by making use of the acceleration variation. Making use of the acceleration variation enables accurate and easy determination of the time point of the switch from the small-variation state to the large-variation state.

As described above, according to the present invention, it is possible to provide a rotation speed measuring system that enables automatic detection of a time point at which the midair movement of a ball ends.

DESCRIPTION OF THE PREFERRED EMBODIMENTS

Figure 1:
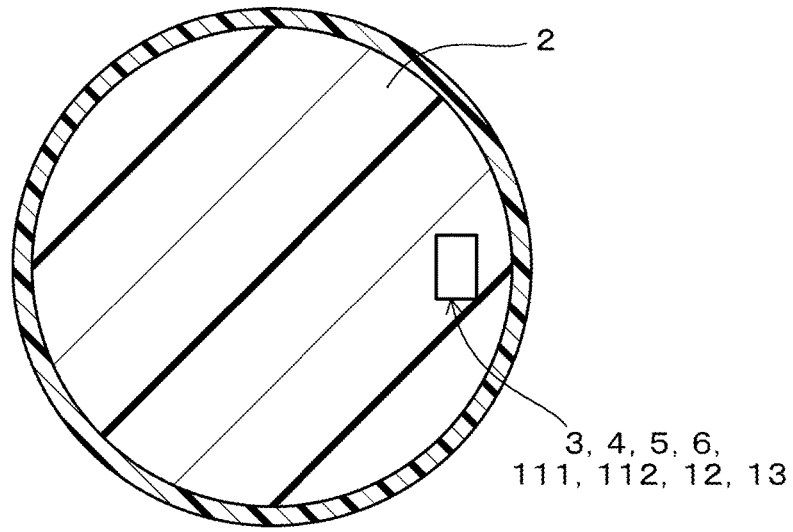
FIG. 1 is a cross sectional view of a ball in Embodiment 1.

The aforesaid rotation speed measuring system preferably includes a start detecting unit that detects, as a start time point at which the midair movement of the ball is considered to be started, a time point of an end of an initial-variation state in which the acceleration variation is equal to or above a predetermined third threshold value after measurement of the acceleration by the acceleration sensor is started. In addition, the calculating unit is preferably configured to calculate the rotation speed of the ball moving in midair by analyzing the frequency of the measurement data on the earth magnetism acquired by the magnetic sensor from the start time point until the end time point.

In this configuration, the start time point can be detected by making use of the changes in acceleration measured by the acceleration sensor. That is, when the ball starts the midair movement, the ball receives a large force from a hand, a foot, or the like, and thus the acceleration of the ball changes greatly in a short time. Therefore, it is possible to detect the start time point by detecting a time point at which the value of the acceleration rapidly changes after the measurement of acceleration by the acceleration sensor is started.

In the case where the start detecting unit is provided, the start time point may be determined by a time point at which the acceleration changes greatly in a short time for the first time after the measurement of the acceleration is started, and the end time point may be determined by a time point at which the acceleration changes greatly in a short time the next time. On the other hand, even in the case where the start detecting unit is not provided, the measured values from the acceleration sensor are also acquired as such, and thus, as previously described, it is possible to determine whether or not the end time point has come by making use of the acceleration variation. In addition, a time period of the midair movement is roughly grasped in advance, and thus, it is also possible to determine the end time point by a time point at which the acceleration changes greatly in a short time after the small-variation state continues for a predetermined time period or longer.

The aforesaid acceleration sensor is preferably configured to measure acceleration in a plurality of axis directions different from one another. In addition, the end detecting unit is preferably configured to detect the end time point by adopting a piece of measurement data having a largest amount of change in the acceleration in the large-variation state, of pieces of measurement data on the acceleration in the plurality of axis directions.

In this configuration, since the acceleration is measured in the plurality of axis directions, there is a high possibility that, in one of the plurality of axis directions, a large change in acceleration can be measured in the large-variation state. Thus, the detection of the end time point is made to be easier than when the acceleration is measured only in one axis direction.

The above acceleration sensor is more preferably configured to measure the acceleration in three axis directions orthogonal to one another.

In this configuration, since the acceleration is measured in the three axis directions, there is a high possibility that, in one of these three axis directions, a large change in acceleration can be measured in the large-variation state. Thus, the detection of the end time point is made to be easier than when the acceleration is measured only in one axis direction or two axis directions.

The above magnetic sensor is preferably configured to measure the earth magnetism in a plurality of axis directions different from one another. In addition, the calculating unit is preferably configured to calculate the rotation speed of the ball by adopting a piece of measurement data having a largest amplitude, of pieces of the measurement data on the earth magnetism in the plurality of axis directions.

In this configuration, since a piece of measurement data having the largest amplitude is adopted out of pieces of the measurement data on the earth magnetism in the plurality of axis directions, it is possible to calculate the frequency more accurately than when the earth magnetism is measured only in one axis direction. Thus, it is possible to calculate the rotation speed of the ball more accurately.

The above magnetic sensor is more preferably configured to measure the earth magnetism in three axis directions orthogonal to one another.

In this configuration, since the rotation speed of the ball can be calculated by adopting a piece of the measurement data having the largest amplitude out of pieces of measurement data on the earth magnetism in the three axis directions, it is possible to measure the rotation speed of the ball more accurately than when the earth magnetism is measured only in one axis direction or two axis directions.

The above ball is preferably provided with a magnetic sensor memory in which the measurement data on the earth magnetism is to be stored, with a measurement time point of each measured values included in the measurement data being distinguishable.

It is also possible to not to store the measurement data on the earth magnetism in a magnetic sensor memory, but to transmit the measurement data wirelessly to a calculating unit that is provided externally. However, if a transmission error occurs in this configuration, the rotation speed of a ball cannot be calculated because the measurement data cannot be retransmitted. In contrast, storing the measurement data on the earth magnetism in the memory enables the measurement data to be read from the memory and retransmitted in the case of a transmission error. Thus, it is possible to calculate the rotation speed of the ball reliably.

The memory stores the measurement data on the earth magnetism with a measurement time point of each measured value included in the measurement data being distinguishable. Thus, it is possible to distinguish which of a plurality of measured values constituting the measurement data on the earth magnetism corresponds to the start time point or the end time point detected with the measurement data from the acceleration sensor. To implement this configuration, actual measurement time points may be stored, or if the measurement is performed at constant time intervals (e.g., 4 ms), each measurement time point may be determined based on the order of the measured values. This is totally true for the case where the measurement data from the acceleration sensor is stored in an acceleration sensor memory.

The quantity of the measurement data of earth magnetism, which is required to measure the rotation speed of a ball tends to be enormous. Thus, in particular, in the case where a magnetic sensor memory is equipped in the ball, it is desired to devise a configuration to reduce the quantity of measurement data to be stored. For example, considering the case of a baseball ball, the rotation speed of the ball reaches as high as 50 rev/s. In addition, to calculate the frequency accurately, it is preferable to acquire five or more pieces of measurement data on the earth magnetism per rotation. Thus, to measure a rotation speed accurately even in the case that the rotation speed is high, it is preferable, for example, to acquire 250 or more pieces of measurement data on the earth magnetism per second. That is, it is necessary to increase the number of pieces of measurement data on the earth magnetism to be acquired per unit time. Therefore, if the measurement data is to be stored for the entire period regardless of whether or not the acquired measurement data is on the midair movement of a ball, the total quantity of measurement data to be stored is increased, which results in increase of a size of the memory. In contrast, if the end time point is detected, as performed by the rotation speed measuring system, there is no need to store pieces of measurement data acquired after the end time point. Therefore, it is possible to reduce the total amount of measurement data to be stored in a memory even when the measurement data on the earth magnetism per unit time has a large amount. Thus, the memory can be reduced in size.

The aforesaid ball is preferably provided with an acceleration sensor memory in which the measurement data on the acceleration is to be stored with a measurement time point of each measured value included in the measurement data being distinguishable.

In this configuration, reading the measurement data on acceleration from the acceleration sensor memory allows the detection of the start time point or the end time point. Thus, it is possible to perform the detection of the start time point and the end time point, reliably.

The aforesaid end detecting unit is preferably provided in the ball.

It is also possible to provide the end detecting unit outside the ball, but in this configuration, the end time point cannot be detected on the ball side. Thus, the end time point cannot be detected unless there are transmitted not only measurement data on the earth magnetism acquired before the end time point but also measurement data on the earth magnetism acquired after the end time point, to the end detecting unit provided outside the ball. Thus, the quantity of measurement data to be transmitted tends to increase. In contrast, if the end detecting unit is provided in a ball, the end time point can be detected on the ball side, and it is possible to transmit only the measurement data on the earth magnetism acquired before the end time point, to the outside. Thus, it is possible to reduce the quantity of measurement data to be transmitted.

The aforesaid magnetic sensor is preferably constituted by a magneto-impedance sensor.

Magneto-impedance sensors (hereafter, also referred to as MI sensors) are excellent in sensitivity to magnetism and responsivity, and, as compared with the other kinds of magnetic sensors, magneto-impedance sensors can acquire a large number of pieces of measurement data in an extremely short time with high accuracy. Thus, using an MI sensor as a magnetic sensor, it is possible to acquire measurement data on the earth magnetism reliably while a ball moves in midair, enabling the rotation speed of the ball to be calculated accurately.

Embodiments (Embodiment 1)

Figure 2:
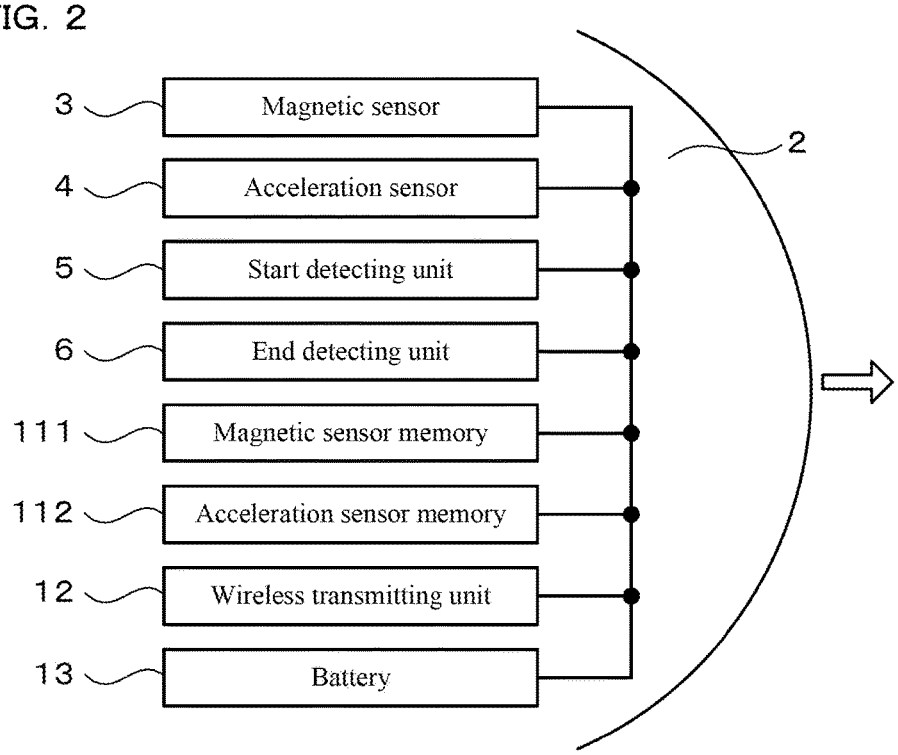
FIG. 2 is a schematic diagram of components in the ball in Embodiment 1.
Figure 3:
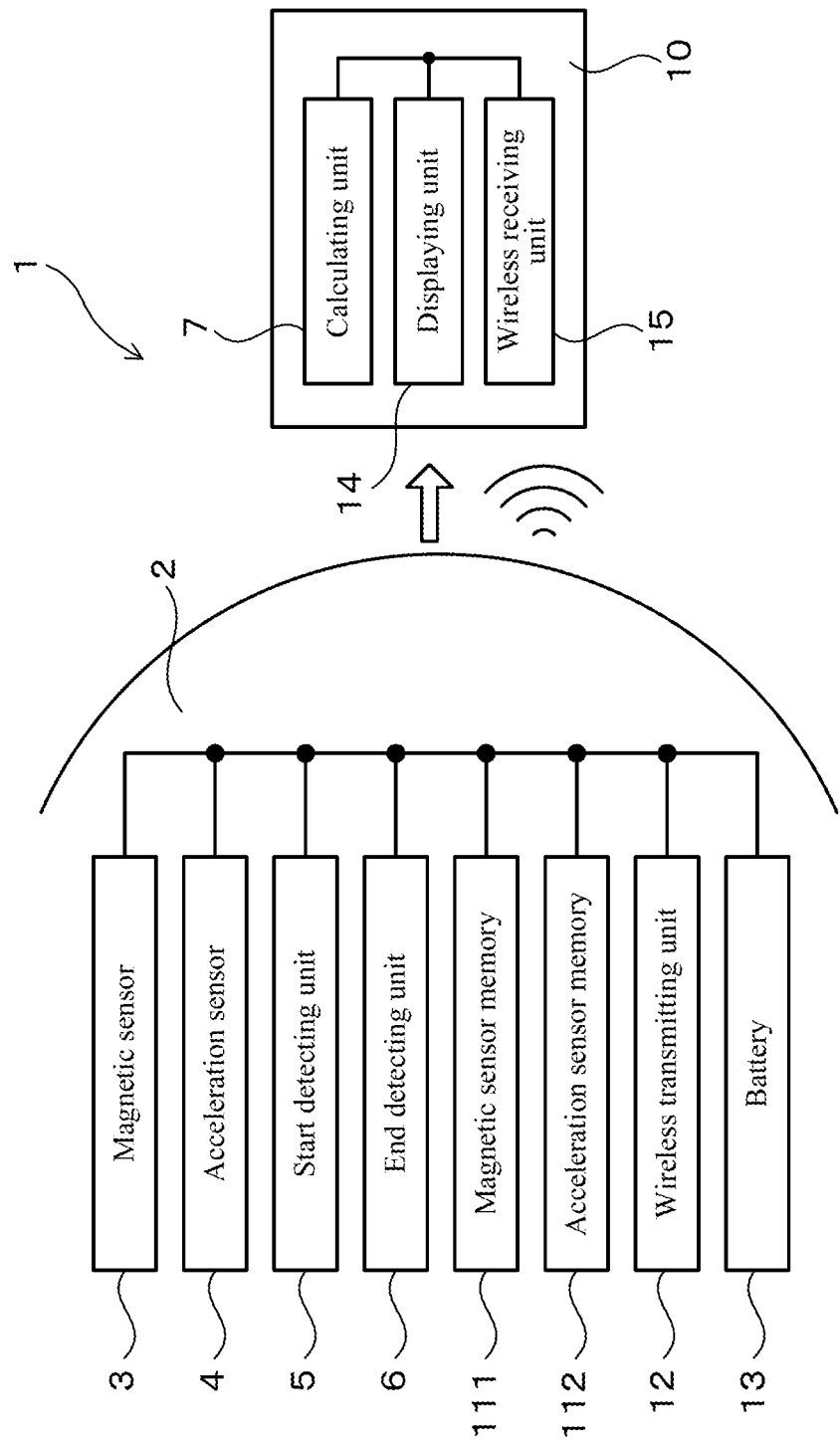
FIG. 3 is a schematic diagram of a rotation speed measuring system in a state in which measurement data from a magnetic sensor is wirelessly transmitted from a memory in the ball, in Embodiment 1.

An embodiment of the aforesaid rotation speed measuring system will be described with reference to FIG. 1 to FIG. 8. A rotation speed measuring system 1 in the present embodiment includes, as illustrated in FIG. 1 to FIG. 3, a magnetic sensor 3, an acceleration sensor 4, an end detecting unit 6, and a calculating unit 7. The magnetic sensor 3 measures earth magnetism in at least one axis direction. The acceleration sensor 4 measures acceleration in at least one axis direction. The magnetic sensor 3 and the acceleration sensor 4 are provided in a ball 2.

The end detecting unit 6 detects, as an end time point $T_E$ at which midair movement of the ball 2 is considered to end, a time point of a switch at which an acceleration variation $|\Delta A|$ obtained as an absolute value of a variation in the acceleration measured by the acceleration sensor in a predetermined small time unit (see FIG. 5) is switched to a large-variation state $S_L$ after a small-variation state $S_S$ (see FIG. 4, FIG. 5) continues for a prescribed time period, wherein the small-variation state corresponds to a state in which the acceleration variation is equal to or below a predetermined first threshold value V1 and the large-variation state corresponds to a state in which the acceleration variation is equal to or above a predetermined second threshold value V2. The ball 2 includes an acceleration sensor memory 112 in which measured values from acceleration sensor 4 necessary to calculate the acceleration variation $|\Delta A|$ are stored. The acceleration sensor memory 112 is required only to secure a capacity to store measurement data on acceleration that is necessary to determine a time point of the switch from the small-variation state $S_S$ to the large-variation state $S_L$, and the acceleration sensor memory 112 is not required to have a large capacity.

The calculating unit 7 calculate the rotation speed of the ball 2 moving in midair by analyzing the frequency of the measurement data on earth magnetism (see FIG. 6) acquired by the magnetic sensor 3 until the end time point $T_E$.

In the present embodiment, as illustrated in FIG. 1 and FIG. 2, the ball 2 is provided therein with a start detecting unit 5, a magnetic sensor memory 111, the acceleration sensor memory 112, a wireless transmitting unit 12, and a battery 13. The ball 2 is a baseball ball. The ball 2 starts midair movement and afterward hits an external member (not illustrated) such as a mitt and a net, to end the midair movement. In the vicinity of the external member, as illustrated in FIG. 3, an external device 10 is disposed. The external device 10 is provided therein with the calculating unit 7, a displaying unit 14, and a wireless receiving unit 15.

Figure 4:
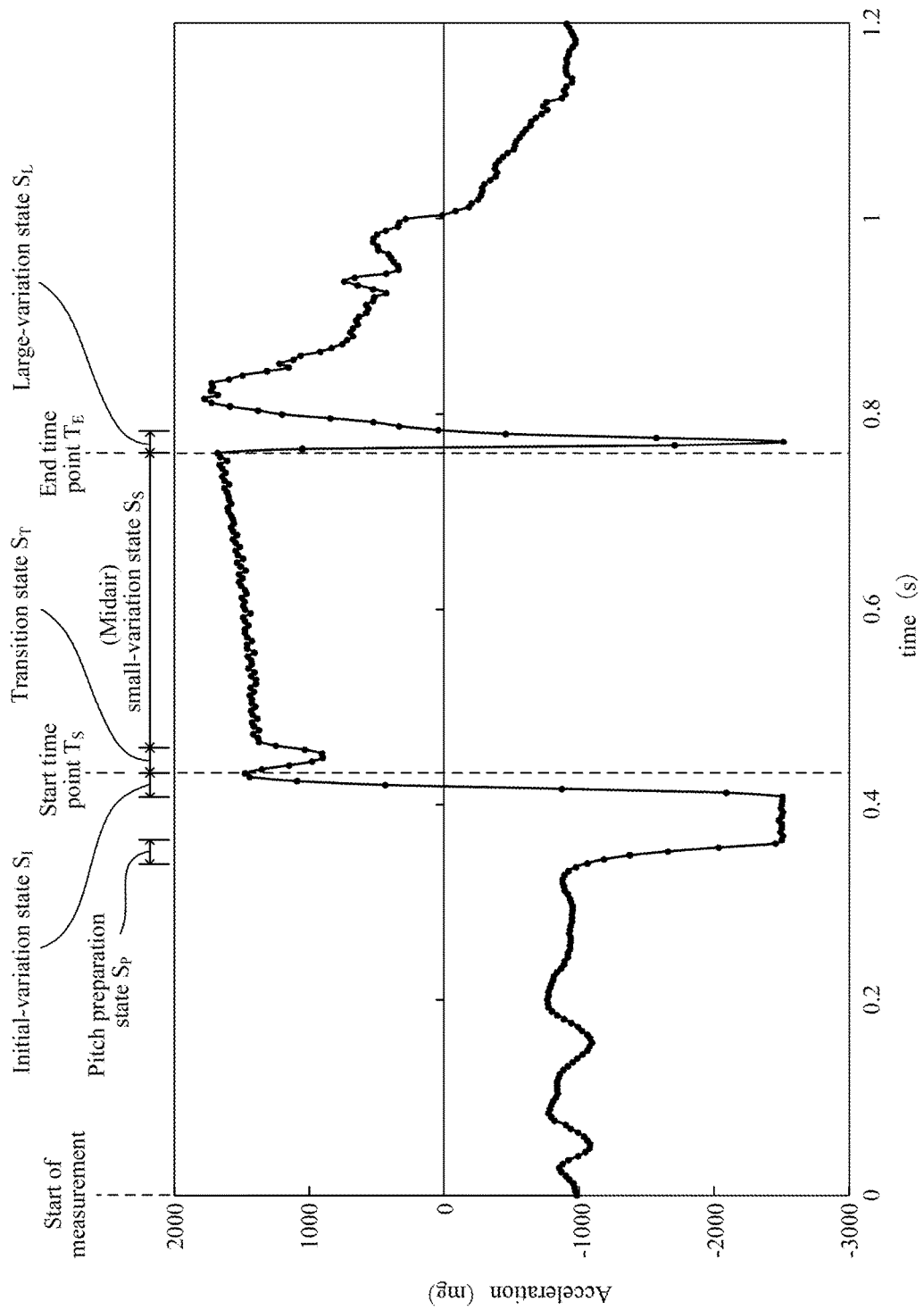
FIG. 4 is a graph illustrating temporal changes in measurement data on acceleration, in Embodiment 1.
Figure 5:
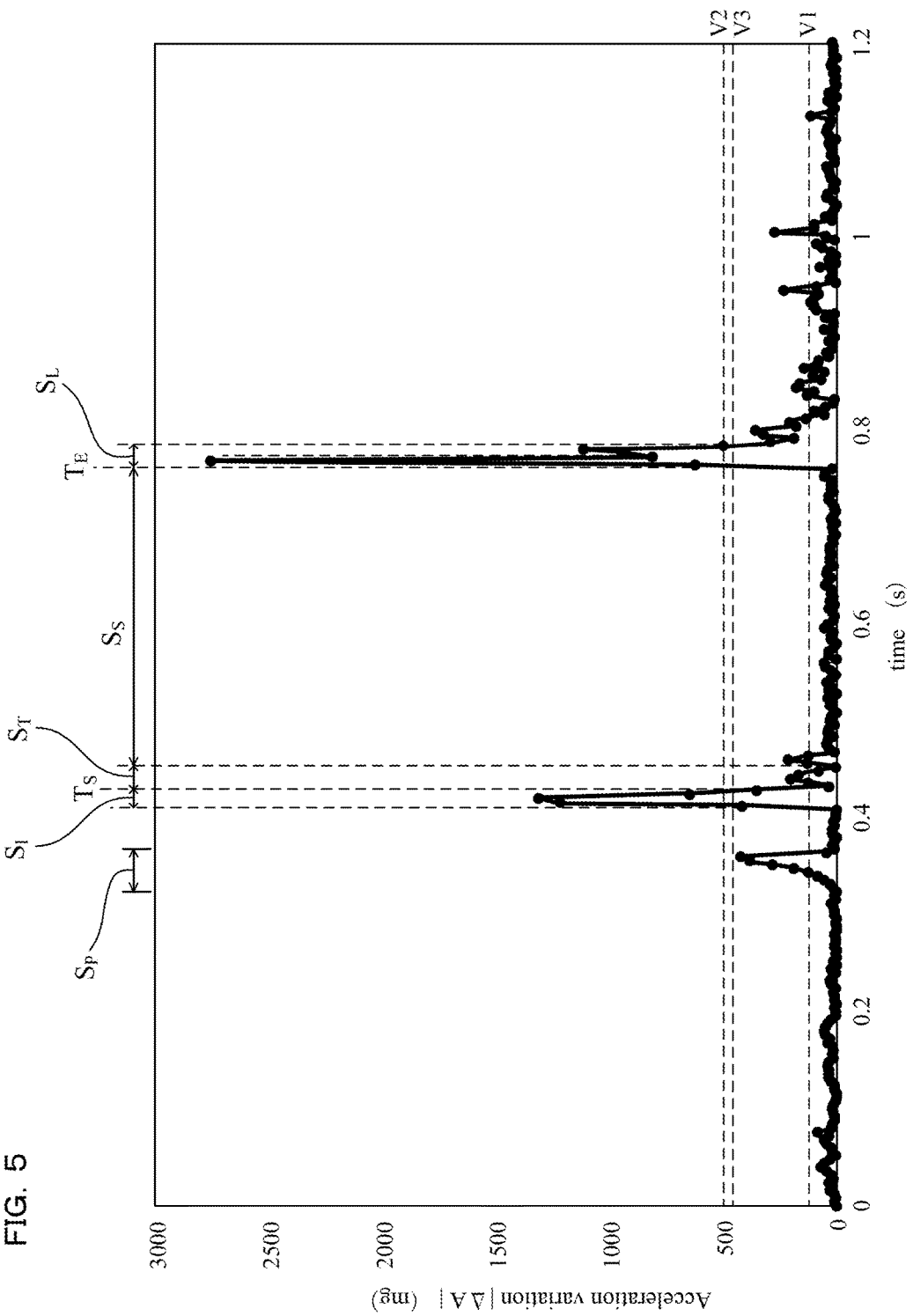
FIG. 5 is a graph illustrating temporal changes in acceleration variation, in Embodiment 1.

The start detecting unit 5 detects, as a start time point $T_S$ at which the midair movement of the ball 2 is considered to start, a time point of an end of an initial-variation state $S_I$ in which the acceleration variation $|\Delta A|$ is equal to or above a predetermined third threshold value V3 after the measurement of acceleration by the acceleration sensor 4 is started (see FIG. 4, FIG. 5). The calculating unit 7 analyzes the frequency of the measurement data on the earth magnetism acquired by the magnetic sensor 3 from the start time point $T_S$ until the end time point $T_E$. From this analysis, the rotation speed of the ball 2 moving in midair is calculated. The calculated rotation speed is displayed on the displaying unit 14.

The above displaying unit 14 may be configured to display an average rotation speed during a time period from the start time point $T_S$ until the end time point $T_E$. Instead, it is also possible to display a plurality of rotation speeds including, for example, an initial rotation speed, an intermediate rotation speed, and a final rotation speed, dividing a time period during which the ball 2 moves in midair into a plurality of segments.

In the magnetic sensor memory 111, the measurement data on the earth magnetism is stored, and in the acceleration sensor memory 112, the measurement data from the acceleration sensor 4 is stored. In the present embodiment, the measurement data on acceleration is extracted from the acceleration sensor memory 112, and the extracted measurement data is used to determine the start time point $T_S$ and the end time point $T_E$. In the magnetic sensor memory 111, measurement data to be stored is not all the measurement data on the earth magnetism but only the measurement data acquired from the start time point $T_S$ to the end time point $T_E$. When the ball 2 hits the external member to end the midair movement, the measurement data on the earth magnetism stored in the magnetic sensor memory 111 is wirelessly transmitted to the wireless receiving unit 15 by the wireless transmitting unit 12. Using the wirelessly transmitted measurement data on the earth magnetism, the calculating unit 7 calculates the rotation speed of the ball 2.

The magnetic sensor 3 in the present embodiment is configured to measure earth magnetism in three axis directions orthogonal to one another, individually. Similarly, the acceleration sensor 4 in the present embodiment is configured to measure acceleration in three axis directions orthogonal to one another. The structure of the magnetic sensor 3 will be described later.

Figure 6:
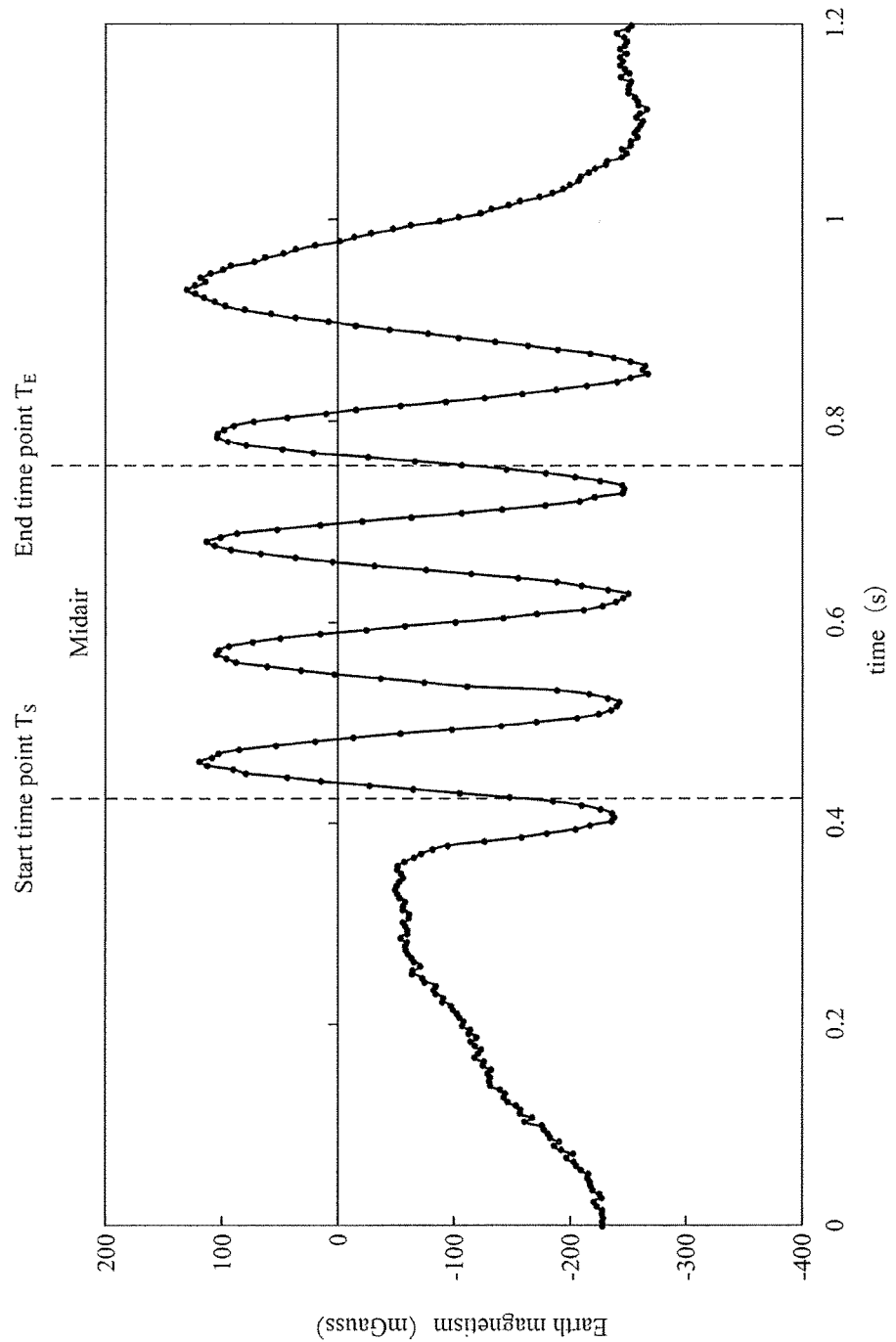
FIG. 6 is a graph illustrating temporal changes in measurement data on earth magnetism, in Embodiment 1.

Now, with reference to FIG. 4 and FIG. 6, there will be described temporal changes in outputs of the acceleration sensor 4 and the magnetic sensor 3 when moving a ball in midair. To begin with, conditions for obtaining graphs illustrated in the drawings will be described. To obtain these graphs, first, the magnetic sensor 3 and the acceleration sensor 4 were provided in a ball 2 for baseball. Then, the ball 2 was rotated and thrown upward in a vertical direction by a hand, and the ball 2 being fallen was caught while being allowed to rotate in a hand. Here, FIG. 4 illustrates a piece of measurement data having the largest amount of change in the large-variation state $S_L$, of pieces of measurement data on acceleration in the three axis directions, measured by the acceleration sensor 4. FIG. 6 illustrates a piece of measurement data having the largest amplitude, of pieces of measurement data on the earth magnetism in the three axis directions, measured by the magnetic sensor 3.

The acceleration sensor 4 is configured to output measurement data on the acceleration every 4 ms. That is, each piece of measurement data of the graph illustrated in FIG. 4 was acquired every 4 ms. With this measurement data, the graph illustrated in FIG. 5 is created. To create the graph illustrated in FIG. 5, the acceleration variation $|\Delta A|$ is defined as the absolute value of the result of subtracting, from each piece of measurement data $A(n)$ acquired by the acceleration sensor 4, a piece of measurement data acquired at the previous time, namely, a piece of measurement data $A(n-1)$ acquired 4 ms before. That is, the acceleration variation $|\Delta A|$ is calculated as follows.

$$|\Delta A|=|A(n)-A(n-1)| \tag{1}$$

As seen from the above, in the present embodiment, the small time unit for calculating the acceleration variation $|\Delta A|$ is set to 4 ms.

In the present embodiment, the measurement data on the acceleration is stored in the acceleration sensor memory 112 together with information on measurement time points, and the measurement data on the acceleration is read from the acceleration sensor memory 112. Then, with this measurement data, an acceleration variation $|\Delta A|$ at each measurement time point is calculated. In the present embodiment, the calculated acceleration variations $|\Delta A|$ are also stored in the acceleration sensor memory 112 together with the time information. With this configuration, it is possible to facilitate determining the duration of the small-variation state $S_S$.

As illustrated in FIG. 4, after the measurement of acceleration is started, the initial-variation state $S_I$ is brought about. This is because the ball 2 receives a force from a hand when thrown in midair, and the acceleration of the ball 2 changes greatly in a short time.

After the initial-variation state $S_I$ ends, the small-variation state $S_S$ is brought about. In the small-variation state $S_S$, the ball 2 receives substantially no other external forces except little air resistance. Thus, the acceleration sensor 4 hardly detects accelerations caused by external forces. In addition, since the ball 2 falls freely, even the gravitational acceleration is not detected. In the small-variation state $S_S$, the ball 2 rotates to generate a centrifugal force, and the acceleration sensor 4 mainly detects an acceleration caused by this centrifugal force. While the ball 2 moves in midair, the centrifugal force is substantially constant, and thus, in the small-variation state $S_S$, measured values of the acceleration are substantially constant.

After the duration of the small-variation state $S_S$ for a certain time period, the large-variation state $S_L$ is brought about. In the large-variation state $S_L$, the ball 2 is caught and receives a large force from a hand. Thus, the acceleration sensor 4 detects a large change in acceleration.

As described above, when the ball 2 starts the midair movement, since the ball 2 receives a large force from a hand, the initial-variation state $S_I$ is brought about. In the initial-variation state $S_I$, the measurement data on the acceleration changes greatly in a short time. Therefore, it is possible to consider the time point of the end of this initial-variation state $S_I$ to be a time point at which the ball 2 starts the midair movement.

At the time when the midair movement is ended, since the ball 2 receives a large force again from the outside, the large-variation state $S_L$ is brought about, the large-variation state $S_L$ being a state in which the measurement data on the acceleration changes greatly in a short time. Therefore, it is possible to consider a time point of a switch from the small-variation state $S_S$ to the large-variation state $S_L$ to be a time point at which the midair movement of the ball 2 ends.

Making use of the acceleration variation $|\Delta A|$ enables automatic detection of the start time point $T_s$ and the end time point $T_E$. That is, as illustrated in FIG. 5, in the initial-variation state $S_I$, since the ball 2 receives a force, and the acceleration of the ball 2 changes greatly in a short time, the acceleration variation $|\Delta A|$ is increased. Thus, it is possible to detect, as the initial-variation state $S_I$, a state in which the acceleration variation $|\Delta A|$ is equal to or above the third threshold value V3. In addition, it is possible to detect, as the start time point $T_s$, a time point at which this initial-variation state $S_I$ ends, namely, a time point at which the acceleration variation $|\Delta A|$ is equal to or below the third threshold value V3.

In the small-variation state $S_S$, since the acceleration does not change greatly, the acceleration variation $|\Delta A|$ takes a small value. Thus, by determining whether or not the acceleration variation $|\Delta A|$ is equal to or below the first threshold value V1 after the start time point Ts, it is possible to determine whether or not the small-variation state $S_S$ is brought about. In addition, when the ball 2 hits an external object such as a mitt to end the midair movement, the ball 2 receives a force, and the acceleration of the ball 2 changes greatly in a short time, thus, the large-variation state $S_L$ is brought about. Accordingly, the acceleration variation $|\Delta A|$ is increased. Therefore, it is possible to detect, as the large-variation state $S_L$, the state in which the acceleration variation $|\Delta A|$ is equal to or above the second threshold value V2. In addition, it is possible to detect, as the end time point $T_E$, a time point of the switch from the small-variation state $S_S$ to the large-variation state $S_L$, namely, a time point at which the acceleration variation $|\Delta A|$ becomes equal to or above the second threshold value V2.

It is noted that, as illustrated in FIG. 4, before the initial-variation state $S_I$, there is also brought about a state in which the acceleration changes relatively greatly (a pitch preparation state $S_P$). This pitch preparation state $S_P$ is considered as a state that is brought about by a motion performed by a hand holding the ball 2 to prepare for throwing the ball 2. The change in measurement data in the pitch preparation state $S_P$ is not as large as the change in measurement data in the initial-variation state $S_I$. That is, in the pitch preparation state $S_P$, the acceleration does not change as sharply as in the initial-variation state $S_I$. Thus, if the change in acceleration in the pitch preparation state $S_P$ is not as sharp as the change in acceleration in the initial-variation state $S_I$, it is possible to distinguish between the pitch preparation state $S_P$ and the initial-variation state $S_I$. If the pitch preparation state $S_P$ and the initial-variation state $S_I$ cannot be distinguished from each other, a time point at which the pitch preparation state $S_P$ ends may be detected as the start time point $T_S$.

As illustrated in FIG. 4, when a switch is made from the initial-variation state $S_I$ to the small-variation state $S_S$, a transition state $S_T$ is brought about, the transition state $S_T$ being a state in which the acceleration slightly varies. In the transition state $S_T$, the ball 2 is about to be released from a hand but not completely released, so that the ball 2 receives a force slightly from a finger. Thus, it is considered that the acceleration sensor 4 detects a small acceleration. Also in this transition state $S_T$, the acceleration does not change as sharply as in the initial-variation state $S_I$. The rotation speed measuring system 1 in the present embodiment does not detect the transition state $S_T$ as the initial-variation state $S_I$ because, as illustrated in FIG. 5, the acceleration variation $|\Delta A|$ smaller than the third threshold value V3.

As illustrated in FIG. 6, the measurement data on the earth magnetism acquired by the magnetic sensor 3 changes in a substantially constant cycle while the ball 2 moves in midair. This is because the ball 2 rotates in midair, and the orientation of the magnetic sensor 3 with respect to the earth magnetism changes cyclically. Therefore, the frequency of the measurement data on the earth magnetism is equal to the number of revolutions of the ball 2 per unit time. Thus, by calculating the frequency, it is possible to determine the rotation speed of the ball 2. The calculation of the frequency can use a method of subjecting the measurement data on the earth magnetism to Fast Fourier Transform (FFT) processing.

After the end time point $T_E$, the frequency of the measurement data on the earth magnetism remains substantially the same as the frequency in the midair movement for a certain time period, and decreases gradually. That is, the cycle of the change grows longer gradually. This is because, in the present embodiment, the earth magnetism is measured in a situation in which a hand catches the ball 2 but does not grasp the ball 2 immediately not to stop the rotation of the ball 2, and the ball 2 keeps rotating for a certain time period in the hand, then decreasing in rotation speed slowly by friction. When the rotation of the ball 2 is not stopped immediately after the catch as in such a case, the frequency of the measurement data on the earth magnetism does not change greatly across the end time point $T_E$. Thus, in this case, it is difficult to detect the end time point $T_E$ accurately only with the magnetic sensor 3. In contrast, the measurement data from the acceleration sensor 4 changes greatly across the end time point $T_E$. Thus, by making use of the measurement data from the acceleration sensor 4, it is possible to detect the end time point $T_E$ accurately even in the case where the rotation of the ball 2 is not stopped immediately after the catch.

Figure 7:
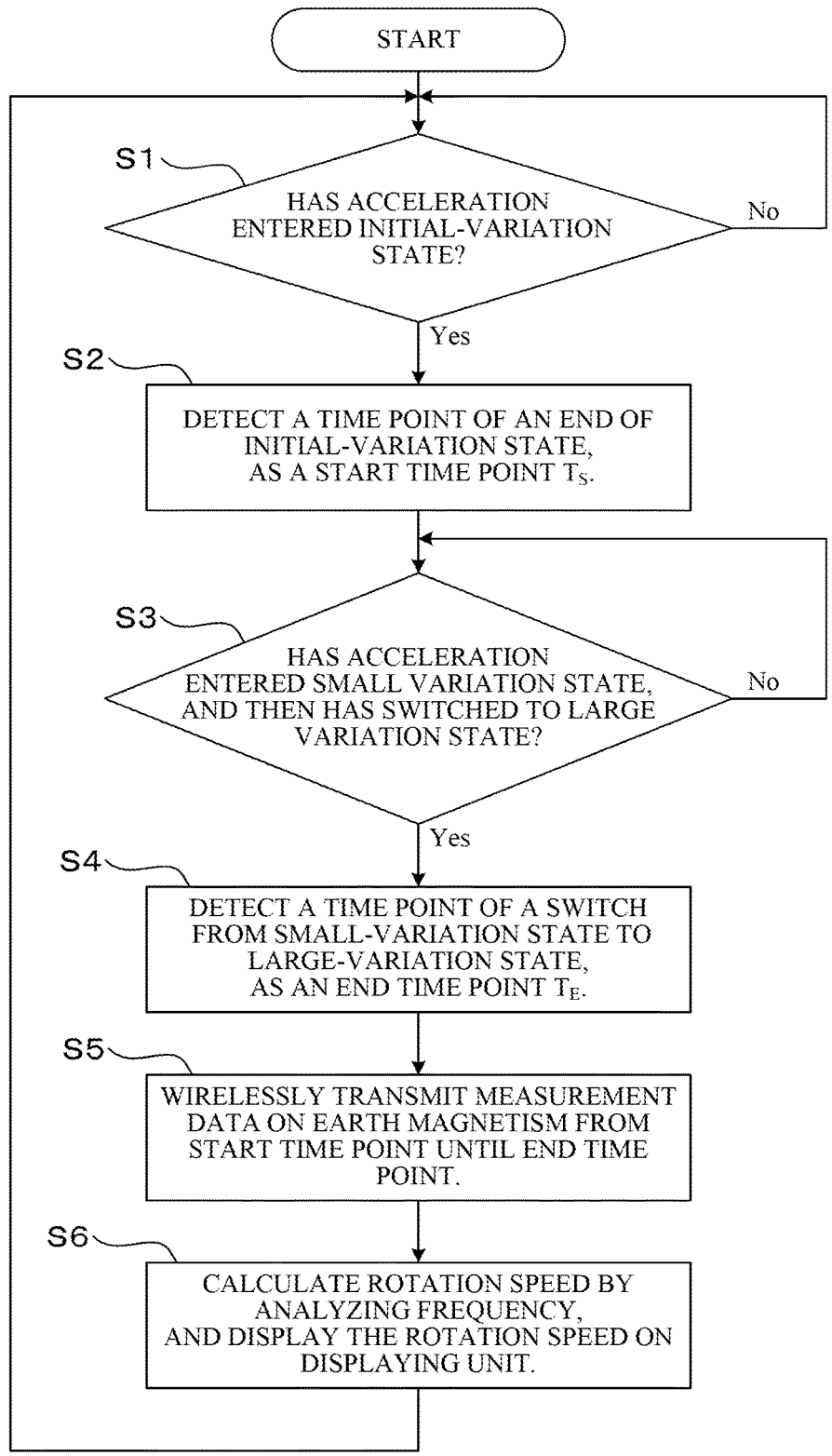
FIG. 7 is a flowchart for the rotation speed measuring system, in Embodiment 1.

Now, a flowchart for the rotation speed measuring system 1 in the present embodiment will be described. As illustrated in FIG. 7, the rotation speed measuring system 1 first executes step S1. In step S1, using the measurement data from the acceleration sensor 4, it is determined whether or not the initial-variation state $S_I$ is brought about. That is, it is determined whether or not there is brought about the state in which the acceleration variation $|\Delta A|$ (see FIG. 5) is equal to or above the third threshold value V3 (the initial-variation state $S_I$). If the determination is Yes here, the flowchart proceeds to step S2. In step S2, the time point at which the initial-variation state $S_I$ ends is detected as the start time point $T_S$.

Subsequently, the flowchart proceeds to step S3. In step S3, it is determined whether or not the ball 2 is brought into the small-variation state and then into large-variation state $S_L$. That is, it is determined whether or not a switch is made from the small-variation state $S_S$ in which the acceleration variation $|\Delta A|$ becomes equal to or below the first threshold value V1, to a state where the acceleration variation $|\Delta A|$ becomes equal to or above the second threshold value V2 (the large-variation state $S_L$). If the determination is Yes here, the flowchart proceeds to step S4.

In step S4, a time point of a switch from the small-variation state $S_S$ to the large-variation state $S_L$ is detected as the end time point $T_E$. Subsequently, the flowchart proceeds to step S5. In step S5, the measurement data on the earth magnetism acquired from the start time point $T_S$ until the end time point $T_E$ is wirelessly transmitted to the external device 10, by the wireless transmitting unit 12. Subsequently, the flowchart proceeds to step S6. In step S6, the calculating unit 7 analyzes the frequency of the measurement data on the earth magnetism acquired from the start time point $T_S$ to the end time point $T_E$ by the magnetic sensor 3, whereby the rotation speed of the ball 2 is calculated. Then, the calculated rotation speed is displayed on the displaying unit 14.

Figure 8:
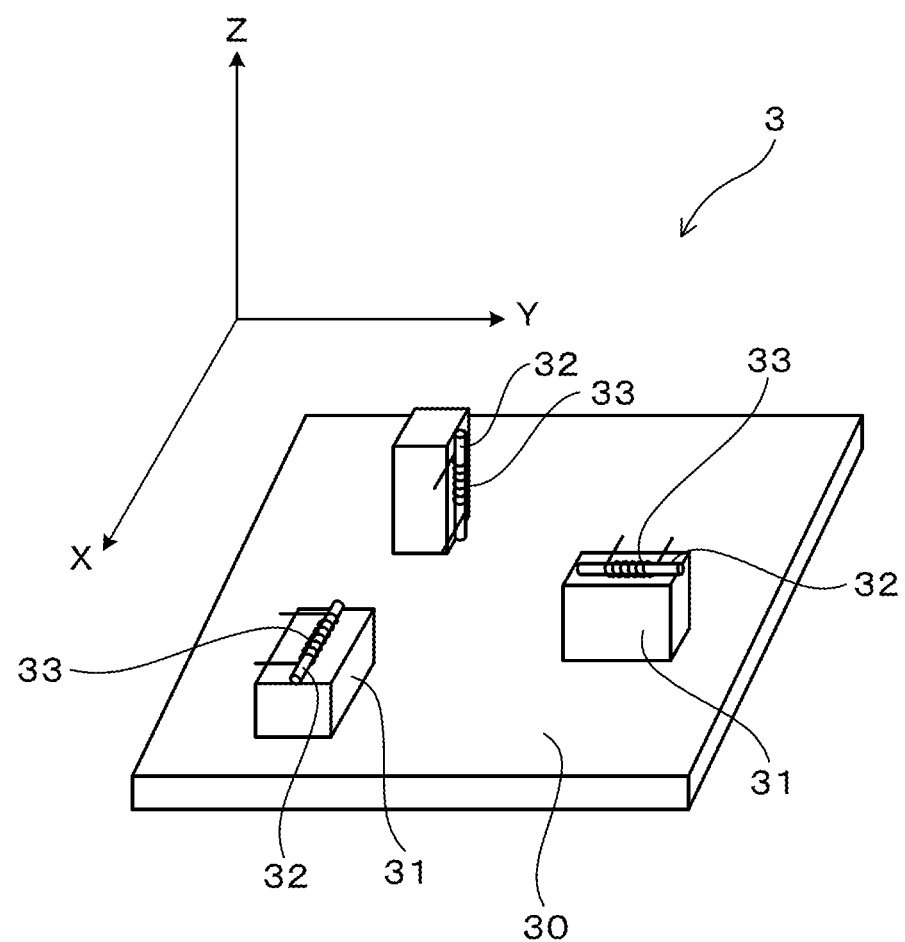
FIG. 8 is a perspective view of a three-axis magnetic sensor, in Embodiment 1.

Now, the structure of the magnetic sensor 3 will be described. The magnetic sensor 3 in the present embodiment is constituted by a magneto-impedance sensor. As illustrated in FIG. 8, the magnetic sensor 3 includes a sensor substrate 30, wire fixing parts 31, amorphous wires 32, and detecting coils 33. The amorphous wires 32 are respectively fixed to the wire fixing parts 31. The number of provided amorphous wires 32 is three. Around each amorphous wire 32, the detecting coil 33 is wound.

The three amorphous wires 32 are oriented in axis directions different from one another (X direction, Y direction, and Z direction). The magnetic sensor 3 is configured to measure an intensity of the earth magnetism in each axis direction, using each amorphous wire 32.

As the acceleration sensor 4, a commercially available capacitance-type sensor is used, the sensor being capable of measuring acceleration in three axis directions orthogonal to one another.

In the present invention, even if a centrifugal force caused by the rotation of the ball 2 has an influence on detected values from the acceleration sensor 4, the start time point $T_S$ and the end time point $T_E$ can be determined. Thus, the acceleration sensor 4 is not necessarily provided in the center of the ball 2 in which the influence of a centrifugal force is small, and may be provided in the vicinity of the surface of the ball 2. However, it is necessary not to make a person holding the ball 2 feel differently as compared with holding normal balls used in actual games.

Now, operational advantages of the present embodiment will be described. As illustrated in FIG. 2 and FIG. 3, in the present embodiment, the acceleration sensor 4 is provided in the ball 2. In addition, the rotation speed measuring system 1 in the present embodiment includes the end detecting unit 6.

Thus, the end detecting unit 6 enables the detection of the end time point $T_E$ at which the midair movement of the ball 2 can be considered to end. That is, while moving in midair, the ball 2 receives substantially no large external forces except little air resistance. Thus, during the midair movement of the ball 2, the acceleration sensor 4 hardly detects accelerations caused by external forces, but mainly detects an acceleration caused by a centrifugal force generated by the rotation of the ball 2, the acceleration being substantially constant. Therefore, during this state, the output of the acceleration sensor 4 is substantially constant. In addition, when the ball 2 hits an external member such as a mitt to end the midair movement, the ball 2 receives a great force, and the acceleration of the ball changes greatly in a short time. Thus, by making a use of a change in acceleration detectable with the acceleration sensor 4, it is possible to detect the end time point $T_E$. That is, it is possible to detect, as the end time point $T_E$, a time point of the transition from a state in which the ball 2 moves in midair, causing the acceleration not to change greatly for a certain amount of time (the small-variation state $S_S$), to a state in which the acceleration changes greatly in a short time (the large-variation state $S_L$).

Meanwhile, there is a conceivable method in which the end time point $T_E$ is detected only with the magnetic sensor 3, without the acceleration sensor 4 provided in the ball 2. That is, in the case where the ball 2 hits a mitt or the like to end the midair movement and decreases in rotation speed quickly in the mitt, the frequency of the measurement data on the earth magnetism decreases quickly. Thus, in this case, by detecting a time point at which the frequency decreases rapidly, the end time point $T_E$ can be detected. However, in the case where the ball 2 hits a soft member such as a net to end the midair movement, the ball 2 keeps the rotary motion for a certain time period after hitting the net or the like, and the rotation speed does not decrease rapidly. Thus, in this case, the measurement data on the earth magnetism does not change greatly for a certain time period across the end time point $T_E$ (see FIG. 6). Therefore, only with the magnetic sensor 3, it is not possible to detect accurately the time point at which the midair movement of the ball 2 ends. In contrast, by using the acceleration sensor 4 as in the present embodiment, a large change in acceleration can be detected with the acceleration sensor 4 also when the ball 2 hits a soft member such as a net (see FIG. 4). Thus, it is possible to detect accurately the time point at which the midair movement of the ball 2 ends.

The rotation speed measuring system 1 in the present embodiment includes the start detecting unit 5. The start detecting unit 5 detects, as a start time point $T_S$ at which the midair movement of the ball 2 is considered to be started, a time point of an end of the initial-variation state $S_I$ in which the acceleration variation $|\Delta A|$ is equal to or above the predetermined third threshold value V3 after the measurement of the acceleration by the acceleration sensor 4 is started.

In such a manner, the start time point $T_S$ can be detected by making use of changes in acceleration measured by the acceleration sensor 4. That is, when the ball 2 starts the midair movement, the ball 2 receives a large force from a hand, a foot, or the like, and thus the acceleration of the ball changes greatly in a short time. Therefore, it is possible to detect the start time point $T_S$ by detecting a time point at which the value of the acceleration rapidly changes after the measurement of acceleration by the acceleration sensor 4 is started.

In addition, detecting the start time point $T_S$ and the end time point $T_E$ eliminates the need of wireless transmitting, to the external device 10, a piece of measurement data on the earth magnetism that is acquired before the ball 2 starts the midair movement or after the ball 2 ends the midair movement. That is, it is possible to wirelessly transmit, to the external device 10, only the measurement data on the earth magnetism acquired while the ball 2 moves in midair. Thus, it is possible to reduce the consumption rate of the battery 13 necessary for the wireless transmission.

The acceleration sensor 4 in the present embodiment is configured to measure acceleration in a plurality of axis directions different from one another. In addition, the end detecting unit 6 is configured to detect the end time point $T_E$ by making use of a piece of measurement data having the largest amount of change in the acceleration in the large-variation state $S_L$, of pieces measurement data on the acceleration in the plurality of axis directions.

In such a manner, since the acceleration is measured in the plurality of axis directions, there is a high possibility that, in one of the plurality of axis directions, a large change in acceleration can be measured in the large-variation state $S_E$. Thus, the detection of the end time point $T_E$ is made to be easier than when the acceleration is measured only in one axis direction.

The start detecting unit 5 in the present embodiment is configured to detect the start time point $T_S$ by making use of a piece of measurement data having the largest amount of change in the acceleration in the initial-variation state $S_I$, of pieces of measurement data on the acceleration in the plurality of axis directions.

In such a manner, since the acceleration is measured in the plurality of axis directions, there is a high possibility that, in one of the plurality of axis directions, a large change in acceleration can be measured in the initial-variation state $S_I$. Thus, the detection of the start time point $T_s$ is made to be easier than when the acceleration is measured only in one axis direction.

The magnetic sensor 3 in the present embodiment is configured to measure the earth magnetism in a plurality of axis directions different from one another. In addition, the calculating unit 7 is configured to calculate the rotation speed of the ball 2 by making use of a piece of measurement data having the largest amplitude, of pieces of measurement data on the earth magnetism in the plurality of axis directions.

In such a manner, since a piece of measurement data having the largest amplitude is used out of the pieces of measurement data on the earth magnetism in the plurality of axis directions, it is possible to calculate the frequency more accurately. Therefore, it is possible to calculate the rotation speed of the ball 2 more accurately.

In the present embodiment, the ball 2 is provided therein with the magnetic sensor memory 111 in which the measurement data on the earth magnetism is stored.

As will be described later, it is also possible to not to store the measurement data on the earth magnetism in the magnetic sensor memory 111, but to transmit the measurement data wirelessly to the calculating unit 7 that is provided externally, but if a transmission error occurs in this configuration, the rotation speed of the ball 2 cannot be calculated because the measurement data cannot be retransmitted. However, storing the measurement data on the earth magnetism in the magnetic sensor memory 111 enables the measurement data to be read from the magnetic sensor memory 111 and retransmitted in the case of a transmission error. Thus, it is possible to calculate the rotation speed of the ball 2 reliably.

The quantity of the measurement data on earth magnetism, which is required to measure the rotation speed of the ball 2 tends to be enormous. Thus, in particular, in the case where the magnetic sensor memory 111 is equipped in the ball 2, it is desired to devise a configuration to reduce the quantity of measurement data to be stored. For example, considering the case of the baseball ball 2, the rotation speed of the ball 2 reaches as high as 50 rev/s. In addition, to calculate the frequency accurately, it is preferable to acquire five or more pieces of measurement data on the earth magnetism per rotation. Thus, to measure a rotation speed accurately even in the case that the rotation speed is high, it is preferable, for example, to acquire 250 or more pieces of measurement data on the earth magnetism per second. That is, it is necessary to increase the number of pieces of measurement data on the earth magnetism to be acquired per unit time. Therefore, if the measurement data is to be stored for the entire period regardless of whether or not the acquired measurement data is on the midair movement of the ball 2, the total amount of measurement data to be stored is increased, which results in increase of the size of the magnetic sensor memory 111. In contrast, if the end time point $T_E$ is detected, as performed by the rotation speed measuring system 1 in the present embodiment, there is no need to store pieces of measurement data acquired after the end time point $T_E$. Therefore, it is possible to reduce the total amount of measurement data to be stored in the magnetic sensor memory 111 even when the measurement data on the earth magnetism per unit time has a large amount. Thus, the magnetic sensor memory 111 can be reduced in size.

The end detecting unit 6 in the present embodiment is provided in the ball 2.

It is also possible to provide the end detecting unit 6 outside the ball 2, but in this configuration, the end time point $T_E$ cannot be detected on the ball 2 side. Thus, the end time point $T_E$ cannot be detected unless not only measurement data on the earth magnetism acquired before the end time point $T_E$ but also measurement data on the earth magnetism acquired after the end time point $T_E$, are transmitted to the end detecting unit 6 provided outside the ball 2. Thus, the quantity of measurement data to be transmitted is prone to be increased. In contrast, if the end detecting unit 6 is provided in the ball 2 as in the present embodiment, the end time point $T_E$ can be detected on the ball 2 side, and it is possible to transmit only the measurement data on the earth magnetism acquired before the end time point $T_S$, to the outside. Thus, it is possible to reduce the amount of measurement data to be transmitted.

The magnetic sensor 3 in the present embodiment is constituted by an MI sensor.

MI sensors have high measurement sensitivities to magnetism. In addition, MI sensors are excellent in responsiveness, allowing a large number of measured values to be acquired in a short time. Thus, by using an MI sensor as the magnetic sensor 3, it is possible to acquire measured values of the earth magnetism accurately and reliably even in the case where a large number of measurements are needed in a short time, for example, 250 measurements per second. Therefore, the rotation speed of the ball 2 can be calculated accurately.

As described above, according to the present embodiment, it is possible to provide a rotation speed measuring system that enables automatic detection of a time point at which the midair movement of a ball ends.

Although the rotation speed measuring system 1 in the present embodiment includes the start detecting unit 5, the present invention is not limited to this configuration. That is, if the ball 2 is provided with a start-up switch, and the ball 2 is thrown immediately after the start-up switch is turned on, measurement data on the earth magnetism can be acquired from a time point substantially equal to the start time point $T_S$. Thus, also in this case, it is possible to calculate the rotation speed of the ball 2 relatively accurately.

Although the start detecting unit 5 in the present embodiment detects the start time point $T_S$ by making use of values of acceleration measured by the acceleration sensor 4, but the present invention is not limited to this configuration. For example, the ball 2 may be provided with a contact sensor that detects whether or not a finger touches the ball 2, and there may be detected, as the start time point $T_S$, a time point at which the ball 2 is thrown, and a finger is taken off the contact sensor.

Although the present embodiment is described assuming that a measurement object for the rotation speed measuring system 1 is a baseball ball, the measurement object may be a ball used in other ball games such as softball, volleyball, soccer, tennis, golf, and table tennis.

Although, in the present embodiment, the small time unit for the calculation of the acceleration variation $|\Delta A|$ is set to 4 ms, the present invention is not limited to this configuration. That is, the small time unit may be set to be longer or shorter than 4 ms. In addition, in the present embodiment, the acceleration variation $|\Delta A|$ is calculated with the formula (1). That is, the acceleration variation $|\Delta A|$ is calculated as the absolute value of the result of subtracting, from each measurement data $A(n)$ acquired by the acceleration sensor 4, a piece of measurement data $A(n-1)$ on acceleration acquired the previous time, but the present invention is not limited to this configuration. That is, from the piece of measurement data $A(n)$, a piece of measurement data $A(n-2)$ on acceleration acquired the second last time may be subtracted, or a piece of measurement data $A(n-3)$ on acceleration acquired the third last time may be subtracted.

(Embodiment 2)

In the following embodiments, among reference numerals used in the drawings, reference numerals identical to those used in Embodiment 1 refer to identical elements or the like in Embodiment 1, unless otherwise noted.

Figure 9:
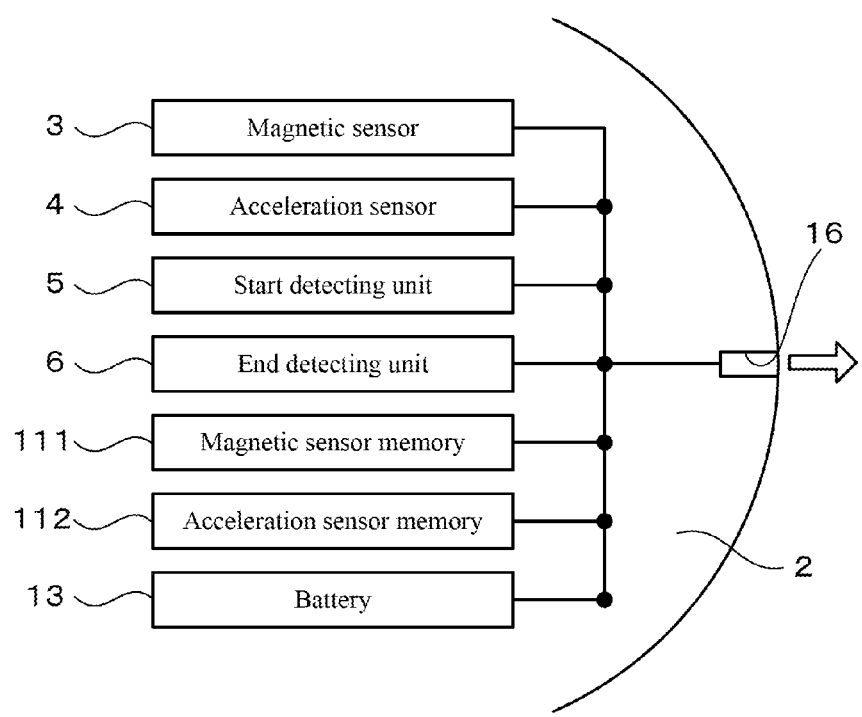
FIG. 9 is a schematic diagram of components in a ball, in Embodiment 2.
Figure 10:
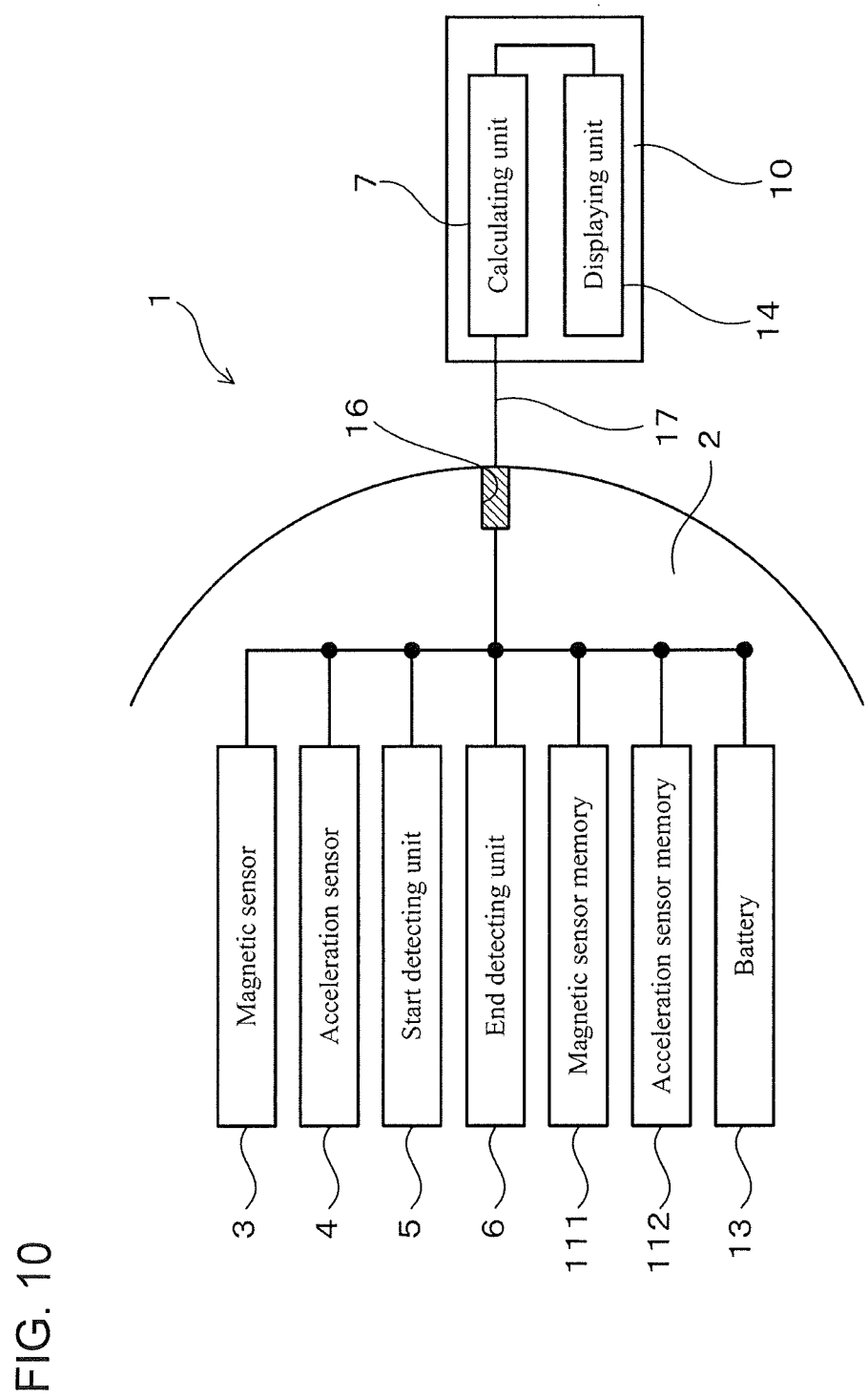
FIG. 10 is a schematic diagram of a rotation speed measuring system in a state in which measurement data from a magnetic sensor is transmitted from the ball to an external device, in Embodiment 2.

The present embodiment is an example in which a different method is used to transmit measurement data on the earth magnetism. As illustrated in FIG. 9, in the present embodiment, a connector 16 is formed in the ball 2. As in Embodiment 1, the ball 2 is configured to store measurement data on the earth magnetism in the magnetic sensor memory 111 while moving in midair. Then, after the midair movement of the ball 2 ends, as illustrated in FIG. 10, a line 17 is connected to the connector 16, and the measurement data on the earth magnetism stored in the magnetic sensor memory 111 is transmitted to the external device 10 through this line 17.

Besides, the present embodiment has the configuration and the operational advantages similar to Embodiment 1.

(Embodiment 3)

Figure 11:
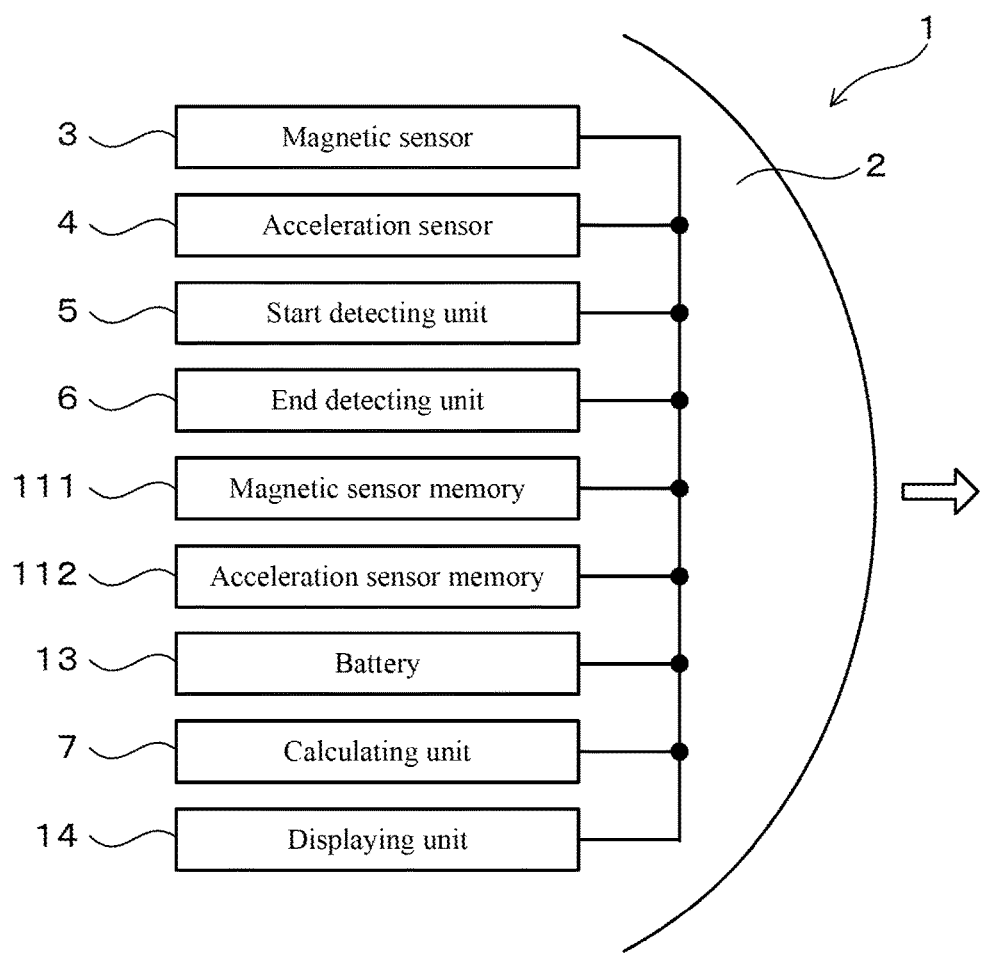
FIG. 11 is a schematic diagram of a rotation speed measuring system, in Embodiment 3.

The present embodiment is an example in which the configuration of components in the ball 2 is changed. As illustrated in FIG. 11, in the present embodiment, the ball 2 is equipped therein with all the components constituting the rotation speed measuring system 1. That is, the ball 2 is provided therein with the magnetic sensor 3, the acceleration sensor 4, the start detecting unit 5, the end detecting unit 6, the magnetic sensor memory 111, the battery 13, the calculating unit 7, and the displaying unit 14. As in Embodiment 1, in the present embodiment, the start detecting unit 5 and the end detecting unit 6 are used to detect the start time point $T_S$ and the end time point $T_E$. The calculating unit 7 calculates the rotation speed of the ball 2 moving in midair by making use of the measurement data on the earth magnetism acquired from the start time point $T_S$ until the end time point $T_E$ by the magnetic sensor 3. Then, the calculated rotation speed is displayed on the displaying unit 14 provided on the ball 2.

Besides, the present embodiment has the configuration and the operational advantages similar to Embodiment 1.

REFERENCE SIGNS LIST

1 ROTATION SPEED MEASURING SYSTEM
2 BALL
3 MAGNETIC SENSOR
4 ACCELERATION SENSOR
5 START DETECTING UNIT
6 END DETECTING UNIT
7 CALCULATING UNIT
|ΔA| ACCELERATION VARIATION

The invention claimed is:

1. A rotation speed measuring system that measures a rotation speed of a ball moving in midair, the rotation speed measuring system comprising:
a magnetic sensor that is provided in the ball and measures earth magnetism at least in one axis direction;
an acceleration sensor that is provided in the ball and measures acceleration at least in one axis direction;
an end detecting unit that detects, as an end time point at which midair movement of the ball is considered to end, a time point at which an acceleration variation, obtained as an absolute value of a variation in the acceleration measured by the acceleration sensor in a predetermined small time unit, is switched to a large-variation state from a small-variation state, wherein the small-variation state corresponds to a state in which the acceleration variation is equal to or below a predetermined first threshold value and the large-variation state corresponds to a state in which the acceleration variation is equal to or above a predetermined second threshold value; and
a calculating unit that calculates the rotation speed of the ball moving in midair by analyzing a frequency of measurement data on the earth magnetism acquired by the magnetic sensor until the end time point.

2. The rotation speed measuring system according to claim 1, further comprising
a start detecting unit that detects, as a start time point at which the midair movement of the ball is considered to be started, a time point of an end of an initial-variation state in which the acceleration variation is equal to or above a predetermined third threshold value after measurement of the acceleration by the acceleration sensor is started, wherein
the calculating unit is configured to calculate the rotation speed of the ball moving in midair by analyzing the frequency of the measurement data on the earth magnetism acquired by the magnetic sensor from the start time point until the end time point.

3. The rotation speed measuring system according to claim 1, wherein the acceleration sensor is configured to measure acceleration in a plurality of axis directions different from one another, and the end detecting unit is configured to detect the end time point by choosing a portion of measured data having a largest amount of change in the acceleration in the large-variation state from portions of the measurement data on the acceleration in the plurality of axis directions.

4. The rotation speed measuring system according to claim 3, wherein the acceleration sensor is configured to measure the acceleration in three axis directions orthogonal to one another.

5. The rotation speed measuring system according to claim 4, wherein the magnetic sensor is configured to measure the earth magnetism in a plurality of axis directions different from one another, and the calculating unit is configured to calculate the rotation speed of the ball by choosing a portion of measurement data having a largest amplitude from portions of the measurement data on the earth magnetism in the plurality of axis directions.

6. The rotation speed measuring system according to claim 5, wherein the magnetic sensor is configured to measure the earth magnetism in three axis directions orthogonal to one another.

7. The rotation speed measuring system according to claim 3, wherein the magnetic sensor is configured to measure the earth magnetism in a plurality of axis directions different from one another, and the calculating unit is configured to calculate the rotation speed of the ball by choosing a portion of measurement data having a largest amplitude from portions of the measurement data on the earth magnetism in the plurality of axis directions.

8. The rotation speed measuring system according to claim 7, wherein the magnetic sensor is configured to measure the earth magnetism in three axis directions orthogonal to one another.

9. The rotation speed measuring system according to claim 1, wherein the magnetic sensor is configured to measure the earth magnetism in a plurality of axis directions different from one another, and the calculating unit is configured to calculate the rotation speed of the ball by choosing a portion of measurement data having a largest amplitude from portions of the measurement data on the earth magnetism in the plurality of axis directions.

10. The rotation speed measuring system according to claim 9, wherein the magnetic sensor is configured to measure the earth magnetism in three axis directions orthogonal to one another.

11. The rotation speed measuring system according to claim 1, wherein the ball is provided with a magnetic sensor memory in which the measurement data on the earth magnetism is to be stored, with a measurement time point of each measured value included in the measurement data being distinguishable.

12. The rotation speed measuring system according to claim 1, wherein the ball is provided with an acceleration sensor memory in which the measurement data on the acceleration is to be stored, with a measurement time point of each measured value included in the measurement data being distinguishable.

13. The rotation speed measuring system according to claim 1, wherein the end detecting unit is provided in the ball.

14. The rotation speed measuring system according to claim 1, wherein the magnetic sensor is constituted by a magneto-impedance sensor.

15. The rotation speed measuring system according to claim 1, wherein the acceleration includes deceleration.

16. A rotation speed measuring system that measures a rotation speed of a ball moving in midair, the rotation speed measuring system comprising:
a magnetic sensor that is provided in the ball and measures earth magnetism at least in one axis direction;
an acceleration sensor that is provided in the ball and measures acceleration at least in one axis direction;
an end detector that detects, as an end time point at which midair movement of the ball is considered to end, a time point at which an acceleration variation, obtained as an absolute value of a variation in the acceleration measured by the acceleration sensor in a predetermined small time unit, is switched to a large-variation state after a small-variation state, wherein the small-variation state corresponds to a state in which the acceleration variation is equal to or below a predetermined first threshold value and the large-variation state corresponds to a state in which the acceleration variation is equal to or above a predetermined second threshold value; and
a calculator that calculates the rotation speed of the ball moving in midair by analyzing a frequency of measurement data on the earth magnetism acquired by the magnetic sensor until the end time point.

* * * * *